United States Patent
Onozawa (10) Patent No.: US 7,183,124 B2
(45) Date of Patent: *Feb. 27, 2007

(54) SURFACE MOUNT SAW DEVICE MANUFACTURING METHOD

(75) Inventor: Yasuhide Onozawa, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 85 days.

This patent is subject to a terminal disclaimer.

(21) Appl. No.: 10/529,525

(22) PCT Filed: Oct. 2, 2003

(86) PCT No.: PCT/JP03/12656

§ 371 (c)(1),
(2), (4) Date: Mar. 29, 2005

(87) PCT Pub. No.: WO2004/032321

PCT Pub. Date: Apr. 15, 2004

(65) Prior Publication Data

US 2006/0053607 A1    Mar. 16, 2006

(30) Foreign Application Priority Data

Oct. 4, 2002    (JP)   ............................. 2002-293110

(51) Int. Cl.
*H01L 21/00*    (2006.01)
(52) U.S. Cl. ............................. 438/22; 438/48; 438/50; 257/416; 257/E21.503; 257/E21.499; 310/313 R
(58) Field of Classification Search .................. 438/48, 438/106, 22, 50; 257/787, 788; 310/313 R
See application file for complete search history.

(56) References Cited

U.S. PATENT DOCUMENTS 6,543,109 B1 * 4/2003 Taga ......................... 29/25.35

(Continued)

FOREIGN PATENT DOCUMENTS

JP          05-055303 A     3/1993

(Continued)

*Primary Examiner*—Long Tran
(74) *Attorney, Agent, or Firm*—Koda & Androlia (57) ABSTRACT

With a surface mount SAW device constituted so that an outer surface of a SAW chip is covered with a heated and softened sheet resin, a resin is filled into skirts of the SAW chip, and so that an airtight space is thereby formed below IDT electrode on a lower surface of the SAW chip, it is possible to dispense with negative pressure suction from through holes formed in a mounting substrate so as to ensure a filling amount of the resin into gaps, and dispense with strict management of heating temperature and suction profiles. A flip-chip mounting step of mounting the SAW chip on the mounting substrate by flip-chip bonding, a lamination step of pressurizing a resin sheet while softening or melting the resin sheet from one end of the mounting substrate toward the other end of the mounting substrate, thereby covering the outer surface of the SAW chip with the resin while securing the airtight space, a press molding step of pressurizing and heating the SAW chip, thereby hardening the resin while suppressing expansion of a gas within the airtight space, and a post-hardening step of heating a SAW device which has been subjected to the press molding step at a temperature and at a time at which the resin is completely hardened, are provided, and a thickness tr of the resin sheet before the lamination step has a relationship of $L/[(X+Gx)(Y+Gy)] \leq tr$.

23 Claims, 5 Drawing Sheets

U.S. PATENT DOCUMENTS

| | | | |
|---|---|---|---|
| 6,670,206 B2 * | 12/2003 | Kim et al. | .................... 438/26 |
| 2003/0164529 A1 * | 9/2003 | Inoue et al. | ................ 257/414 |
| 2004/0239449 A1 * | 12/2004 | Stelzl et al. | ................ 333/187 |

FOREIGN PATENT DOCUMENTS

| | | |
|---|---|---|
| JP | 05-090885 | 4/1993 |
| JP | 07-176565 A | 7/1995 |
| JP | 2000-091381 A | 3/2000 |
| JP | 2001-176995 | 6/2001 |
| JP | 2001-298251 | 10/2001 |
| JP | 2001-332654 A | 11/2001 |
| JP | 2002-504773 A | 2/2002 |
| JP | 2002-184884 | 6/2002 |
| JP | 2002-198403 A | 7/2002 |
| JP | 2002-232260 A | 8/2002 |
| JP | 2003-017979 | 1/2003 |
| JP | 2003-032061 | 1/2003 |
| JP | 2003-264442 | 9/2003 |
| JP | 2003-28295 A | 10/2003 |
| JP | 2003-298389 | 10/2003 |
| JP | 2004-007051 | 1/2004 |
| WO | WO 97/02596 | 1/1997 |

* cited by examiner

SURFACE MOUNT SAW DEVICE MANUFACTURING METHOD

This application is a 371 PCT/JP03/12656 filed on Oct. 02, 2003.

TECHNICAL FIELD

The present invention relates to a surface mount surface acoustic wave (hereinafter referred to as "SAW") device manufacturing method capable of solving various disadvantages that occur at steps of manufacturing a SAW device configured so that a SAW chip is mounted on a substrate using bumps by face-down mounting method and the SAW chip is sealed by a resin sealing layer.

BACKGROUND ART

A SAW device is constituted so that a pattern of interdigital transducer (hereinafter referred to as "IDT") electrodes, a reflector, connection pads, and the like is arranged on a piezoelectric substrate consisting of quartz crystal, lithium tantalate, or the like. A SAW is activated by, for example, providing a high-frequency electric field to the IDT electrodes, and filter characteristics are obtained by converting the SAW into a high-frequency electric field by a piezoelectric effect.

Meanwhile, as a small-sized packaging technique referred to as "chip size package (CSP)" has been widely used for semiconductor components, a manufacturing method using the CSP technique has been introduced with a view of facilitating miniaturization of the SAW device, and improving productivity based on a batch manufacturing method.

CSP related techniques for the SAW device are disclosed in Japanese Patent Laid-Open Nos. 2001-176995 and 2002-184884, and International Patent Application publication No. WO97/02596.

Figure 10:
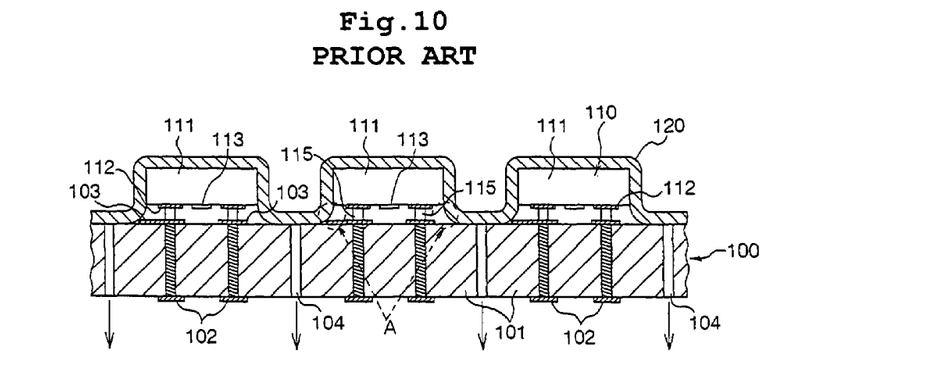
FIG. 10 is an explanatory view for a conventional SAW chip.

FIG. 10 is a cross-sectional view which shows a SAW device disclosed in the Japanese Laid-Open No. 2001-176995. SAW chips 110 are provided on an each one piece domain of a sheet-shaped substrate 100 by flip-chip bonding. A film 120 which can be transformed by heat is provided over the SAW chips 110, and heated up to a softening temperature of the film, thereby the transformed film 120 is provided region between the SAW chips.

The sheet-shaped substrate 100 includes surface mounting external electrodes 102 provided on lower surfaces of respective insulating substrates 101 that constitute the respective piece domain, lands 103 conductive to the external electrodes 102 and provided on upper surfaces of the respective insulating substrates, and through holes 104 provided in boundaries among the respective insulating substrates 101, and letting the air out. Each SAW chip 110 includes connection pads 112 and an IDT electrode 113 on a lower surface of a piezoelectric substrate 111. By connecting the connection pads 112 to the respective lands 103 through conductor bumps 115, the SAW chip 110 is mounted on each insulating substrate 101. Further, by closely attaching the film 120 onto outer surfaces of all the SAW chips 110 and an upper surface of the mounting substrate through the above-stated steps of procedure, and then cutting and dividing the mounting substrate along boundary lines of the respective insulating substrates, pieces of SAW devices can be obtained.

According to this conventional technique, the through holes 104 are arranged in mounting substrate portions corresponding to valleys among the respective SAW chips 110. By performing negative pressure suction from the through holes 104 simultaneously with softening of the film 120, the film 120 can be closely attached onto outer surfaces of the SAW chips and the upper surface of the mounting substrate 101. As a result, an airtight space S for SAW propagation can be formed between the IDT electrode 113 and the upper surface of the insulating substrate 101.

According to this conventional technique, however, the air suction is performed not near the airtight space S but at the positions corresponding to the valleys among the SAW chips. Due to this, the film 120 cannot closely attached onto upper surfaces of the insulating substrates 101 since the film 120 cannot sufficiently be provided at end portion of SAW chips indicated by symbol A in the drawing. If an entry amount of the film 120 at the region A is insufficient, the film 120 cannot adhere to the insulating substrates 101. Then portions of the film 120 floating from the upper surfaces of the insulating substrates 101 are cut off when the mounting substrate is diced along the boundary lines of the insulating substrates 101 to be divided into the respective piece regions. As a result, holes communicating with the airtight space S may possibly be formed, and it is impossible to hold airtightness of space S. As a result, dustproofness and dampproofness of the SAW devices are disadvantageously and greatly deteriorated.

To cope with such disadvantages, the film of circumference of a SAW device is pushed to the insulating substrates 101 by means of a special die to obtain a rigid airtight structure. However, the die has a special shape, thereby disadvantageously causing cost increase. The cost increase is conspicuous particularly whenever a cutting pitch at which the mounting substrate 100 is cut into the respective piece regions is changed or whenever the size of the SAW chips is changed since different shape of dies are required.

The Japanese Patent Laid-Open No. 2002-184884 discloses a technique for enabling the resin heated and softened to sufficiently spread into the gaps A by providing the through holes 104 for letting air out of space S being arranged on a substrate 101 located underneath of a SAW chip. To do so, however, the through holes 104 need to be closed by plug members soon after the air is sucked from the through holes 104, which disadvantageously increases the number of steps. If a low viscosity resin is used as a material for the plug members, then the resin enters into the airtight space S and adheres to the IDT electrodes 113. As a result, SAW propagation may possibly, disadvantageously be disturbed. On the contrary, if a high viscosity resin is used as a material for the plug members, then moisture enters into the airtight space S from interfaces between the plug members and inner walls of the through holes 104 due to a low adhesiveness of the resin to the inner walls of the through holes. As a result, the disadvantage may possibly occur.

Further, the Japanese Patent Laid-Open No. 2002-184884 discloses, similarly to the Japanese Patent Laid-Open No. 2001-176995, a techniques for providing air extraction through holes in mounting substrate portions corresponding to the valleys among the SAW chips, sucking the air when the resin film is heated, and setting a temperature for deforming the resin film to be lower than a temperature at which the resin film is hardened. This conventional technique has the same disadvantage as that of the Japanese Patent Laid-Open No. 2001-176995 in that the resin cannot sufficiently enter into the gaps between the SAW chips. Besides, this conventional technique has the following disadvantage. The air in the airtight space S is thermally expanded when the temperature of the resin film is raised from the softening temperature of the resin to the hardening temperature of the resin. As a result, the resin provided between the gaps comes off from the top surface of the substrate 100, and voids tend to be generated. When so many voids are generated, holes are formed in the resin portions after the mounting substrate is diced into the respective piece regions, resulting in considerable deterioration of the dustproofness and the dampproofness of the SAW devices. In order to solve these disadvantages, it is necessary to reduce the pressure of the internal space so that the resin does not come off from the top surface of the substrate 100 even when the air within the airtight space is thermally expanded. This, in turn, makes it necessary to strictly manage temperature and suction profiles, resulting in complicated manufacturing steps and complicated manufacturing devices.

According to a manufacturing method disclosed in the International publication No. WO97/02596, while a thin sheet resin is provided on the upper surfaces of the SAW chips mounted on the insulating substrates by face-down mounting method and flip-chip bonding, the resin is heated up to the softening (melting) temperature, thereby closely attaching the sheet resin onto the top and side surfaces of the SAW chips and the upper surfaces of the insulating substrates with high viscosity kept. The temperature is further raised up to the hardening temperature, thereby fixing the shape of the resin. According to the manufacturing method of the International publication No. WO97/02596, when the resin is heated up to the softening temperature, the viscosity of the resin that has been softened is increased so as not to flow the resin into the gaps between the under surface of the SAW chips and the upper surfaces of the insulating substrates. Due to this, wettability of the softened resin to the insulating substrates is deteriorated, adhesiveness of the resin to the insulating substrates is deteriorated, and the resin is disadvantageously, easily separated from the insulating substrates. If the separation occurs even slightly, moisture tends to enter into the airtight space from interfaces between the resin and the insulating substrates. In order to solve this disadvantage, if the viscosity of the resin is reduced during the softening of the resin, the resin enters into the airtight space and tends to adhere to the IDT electrodes. This disadvantageously causes disturbance of the SAW propagation, and considerable deterioration of electric characteristics of the SAW devices.

The present invention has been achieved in view of the conventional disadvantages. It is an object of the present invention to provide a method of manufacturing a surface mount SAW device constituted so that SAW chips are mounted on a pattern of a mounting substrate through conductor bumps by face-down method and flip-chip bonding, a sheet resin provided on upper surfaces of the SAW chips is heated and softened to cover outer surfaces of the SAW chips with the sheet resin, and so that the resin is filled into gaps between the SAW chips and on an upper surface of the mounting substrate, thereby form an airtight space between IDT electrodes on lower surfaces of the SAW chips and the upper surface of the mounting substrate, wherein the method can dispense with negative pressure suction from through holes formed in the mounting substrate so as to ensure a filling amount of the resin into the gaps, and can dispense with strict management of heating temperature and suction profiles so as to ensure adhesiveness between the resin and the mounting substrate.

DISCLOSURE OF THE INVENTION

In order to achieve the object described the above, the present invention according to claim 1 provides a method of manufacturing a surface mount SAW device, the surface mount SAW device comprising: a mounting substrate that includes an insulating substrate, an external electrode provided on a bottom of the insulating substrate, and a wiring pattern arranged above the insulating substrate and connecting to said external electrode; a SAW chip that includes a piezoelectric substrate, an IDT electrode formed on one surface of the piezoelectric substrate, and a connection pad connected to said wiring pattern through a conductor bump; and a sealing resin that is formed to cover the SAW chip while mounting said SAW chip on the mounting substrate in a face-down method by flip-chip bonding, and that thereby forms an airtight space between said IDT electrode and said mount substrate, the method comprising: a flip-chip mounting step of connecting said wiring pattern to said connection pad through said conductor bump, thereby mounting the SAW chip on said mounting substrate by the flip-chip bonding; a lamination step of mounting a resin sheet, larger in an area than an upper surface of said SAW chip, on the upper surface of the SAW chip, and pressurizing the resin sheet while softening or melting the resin sheet from one end of the mounting substrate to the other end of the mounting substrate, thereby covering the outer surface of the SAW chip with a resin while securing said airtight space; a press molding step of pressurizing and heating the SAW chip having the outer surface laminated with said resin, thereby hardening the resin while suppressing expansion of a gas within said airtight space; and a post-hardening step of heating the SAW device which has been subjected to the press molding step at a temperature and at a time at which the resin is completely hardened, wherein a thickness tr of the resin sheet before said lamination step satisfies:

$$L/[(X+Gx)(Y+Gy)] \leq tr, \text{ where}$$

$$L=(X+Gx)(Y+Gy)(H+T+A)-XYT-XYA-[XVyA+YVxA+(4VxVyA)/3],$$

(L: a volume of the resin sheet necessary to seal the outer surface of one SAW chip, X: a length of one side of the SAW chip, Y: a length of the other side of the SAW chip, Gx: a distance between SAW chips adjacent in X direction, Vx: a distance from a dicing cutting margin extending in Y direction to a side surface of the proximate SAW chip, Gy: a distance between the SAW chips adjacent in Y direction, Vy: a distance from a dicing cutting margin extending in X direction to a side surface of the proximate SAW chip, H: a thickness of the resin located on the upper surface of one SAW chip after the outer surface of one SAW chip is completed in being covered with the resin sheet, T: a thickness of the piezoelectric substrate, and A: a distance from an upper surface of a mounting substrate base material to a bottom of the piezoelectric substrate).

According to the above, by setting the thickness of the resin sheet to be used at an appropriate value when executing the resin sealing step constituted by the lamination step, the press molding step, and the post-hardening step, it is possible to ensure spreading the softened resin filled into the valleys among the SAW chips and forming the airtight space, and possible to prevent deformation of the sealing resin due to thermal expansion of the airtight space. In particular, when the substrate is divided into pieces of the SAW devices by dicing, there is no fear of forming holes communicating the airtight space with the external air in the resin portions.

According to another embodiment of the present invention, a method of manufacturing a surface mount SAW device according to claim 1, characterized in that said lamination step uses a pressure roller and a guide member, said pressure roller is heated to a predetermined temperature and presses the upper surface of the resin sheet as rotating, said guide member supports the lower surface of said mounting substrate, and in that the lamination step satisfies the following conditions: (a) a heating temperature of the pressure roller is set to be equal to or higher than a softening or melting temperature of the resin sheet and lower than a hardening temperature of the resin sheet; (b) the resin sheet is softened or molten by heating and pressurizing the upper surface of said resin sheet using said pressure roller; and (c) the resin sheet thus softened or molten is heated and pressurized using the pressure roller, thereby covering the SAW chip with the resin while securing said airtight space.

According to the above, it is possible to ensure filling the softened resin into the valleys among the SAW chips, and possible to form the airtight space having an ideal shape and an ideal volume.

According to another embodiment of the present invention, a method of manufacturing a surface mount SAW device according to claim 1, characterized in that said lamination step uses a blade and a guide member, said blade is heated to a predetermined temperature, said blade moves in one direction while being press-contacted at its tip with an upper surface of said resin sheet, and in that the lamination step satisfies the following conditions: (a) a heating temperature of said blade is set to be equal to or higher than a softening or melting temperature of the resin sheet and lower than a hardening temperature of the resin sheet; (b) said resin sheet is softened or molten by heating and pressurizing the upper surface of said resin sheet using the blade; and (c) the resin sheet thus softened or molten is heated and pressurized using the blade, thereby covering the SAW chip with the resin while securing the airtight space.

The third invention described the above is characterized in that, by pressurizing the upper surface of the resin sheet using the heated blade instead of using said pressure roller, the resin sheet is softened or molten and the SAW chip is covered with the resin.

The lamination step may be executed by pressing the resin sheet using the heated blade instead of using the heat roller, and this lamination step can exhibit the same advantage as that of the lamination step using the heat roller.

According to another embodiment of the present invention, a method of manufacturing a surface mount SAW device according to any one of claim 1, 2, or 3, characterized in that said resin sheet is constituted so that a separable protection film is bonded onto an upper surface of a resin sheet main body that has viscosity, and in that, after said lamination step and said press molding step are sequentially executed while a lower surface of the resin sheet main body is provided on the upper surface of the SAW chip, said protection film is separated.

The resin sheet main body has such a viscosity as to be temporarily bonded onto said SAW chip when being provided on the SAW chip. Therefore, by bonding the protection film having a good separation property onto the upper surface of the resin sheet against which the pressurizing member or the like is contacted, the disadvantage that the resin sheet adheres to the pressing roller, the blade, and the pressurizing member at the lamination step and the press molding step can be prevented.

According to another embodiment of the present invention, a method of manufacturing a surface mount SAW device according to any one of claim 1 to 4, characterized in that said protection film consists of polyethylene terephthalate (PET).

According to another embodiment of the present invention, a method of manufacturing a surface mount SAW device according to any one of claim 1 to 5, characterized in that said lamination step is executed in a reduced-pressure atmosphere.

Accordingly, the air extraction during said lamination step can be securely performed.

According to another embodiment of the present invention, a method of manufacturing a surface mount SAW device according to any one of claim 1 to 5, characterized in that said lamination step is executed in an inert gas atmosphere.

Accordingly, the airtight space after the completion of resin sealing is filled with an inert gas, and an aging characteristics of the SAW device can be improved.

According to another embodiment of the present invention, a method of manufacturing a surface mount SAW device according to any one of claim 1 to 7, characterized in that said mounting substrate has a predetermined area on which a plurality of SAW chips can be mounted, and in that, at said lamination step, the resin sheet having a large area is laminated on a plurality of SAW chips mounted on the mounting substrate base material after the large-area resin sheet is provided to spread over upper surfaces of the plurality of SAW chips.

According to the manufacturing method of the above, by performing the batch processing using the mounting substrate base material, mass-productivity can be improved.

According to another embodiment of the present invention, a method of manufacturing a surface mount SAW device according to any one of claim 8, characterized in that, at said press molding step executed using said pressure roller or said blade to apply heat and pressure on said resin and/or said mounting substrate, uses spacers to control a pressing force against SAW chip so as to prevent an excessive pressure from being applied to the SAW chip pieces laminated with the resin.

By using the spacers to prevent excessive pressing without depending on fine adjustment of a pressing force by the pressing roller and the blade that constitute the lamination device, it is possible to appropriately fill the resin sheet into the valleys among the SAW chips and expand the resin sheet.

According to another embodiment of the present invention, a method of manufacturing a surface mount SAW device according to any one of claim 8 or 9, characterized in that, at said press molding step, a frame is arranged on the resin sheet provided on the plurality of SAW chips mounted on said mounting substrate base material, the overall mounting substrate base material is press-molded together with the frame, and the mounting substrate base material is press-molded while the resin located below the frame is pressed.

By providing the large-area resin sheet on a plurality of SAW chips densely arranged on the mounting substrate base material, and press-molding the outer periphery of the upper surface of the resin sheet through the frame, the resin located below the frame is pressed, and entry of the resin into the skirts of the SAW chips located on the outer periphery of the SAW chips can be accelerated.

According to another embodiment of the present invention, a method of manufacturing a surface mount SAW device according to any one of claim 10, characterized in that said frame is integrated with a pressurizing member that press-molds the frame.

The frame may be provided separately from the pressurizing member (the metal plate or the upper die of the pressing machine). However, the integrated frame is convenient to handle and can improve workability.

According to another embodiment of the present invention, a method of manufacturing a surface mount SAW device according to any one of claim 8 or 9, characterized in that, at said press molding step, said frame is arranged on said mounting substrate base material so as to surround the plurality of SAW chips at a position away at an outside diameter side, the resin sheet provided on upper surfaces of the plurality of SAW chips is press-molded, and expansion of the mounting substrate base material toward a side surface of the resin sheet is suppressed by an inner peripheral surface of the frame.

Since the frame is the means for preventing the resin sheet from being expanded sideway when the resin sheet is pressurized, the frame may be arranged on the upper surface of the mounting substrate base material.

BRIEF DESCRIPTION OF THE DRAWINGS

FIGS. 1(*a*) and 1(*b*) are an external perspective view and a longitudinal sectional view of a surface mount SAW device to be manufactured by a manufacturing method according to one embodiment of the present invention, respectively.

FIGS. 3(*a*) and 3(*b*) are a plan view and a front longitudinal sectional view which show a step of mounting the SAW chip on each piece region on a mounting substrate base material by flip-chip bonding, respectively.

FIGS. 5(*a*) and 5(*b*) are cross-sectional views for explaining a heat roller lamination step of laminating the resin sheet temporarily bonded onto each SAW chip on the SAW chip by a lamination device.

FIGS. 7(*a*) and 7(*b*) are explanatory views for a press molding step after the lamination step.

FIGS. 8(*a*) and 8(*b*) are explanatory views for a post-hardening step.

BEST MODE FOR CARRYING OUT THE INVENTION

The present invention will be explained in detail by the embodiments shown in the drawings.

Figure 1:
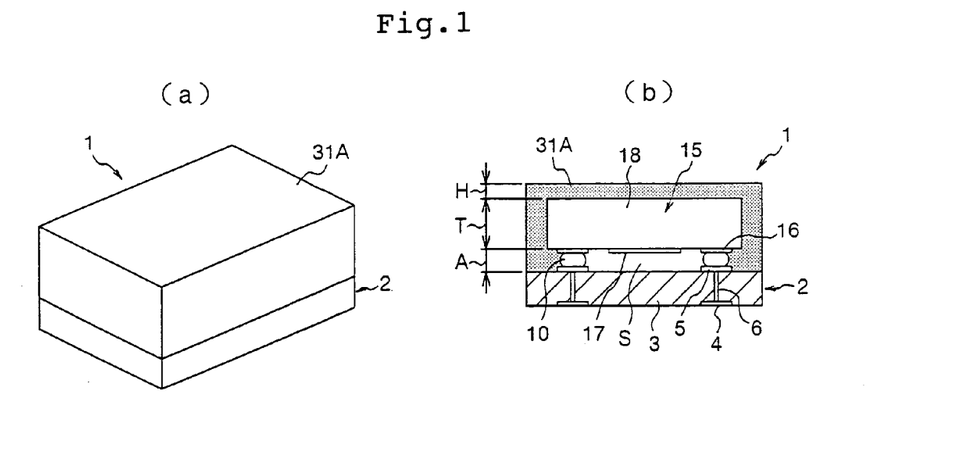

FIG. 1(*a*) and FIG. 1(*b*) are an external perspective view and a longitudinal sectional view of a surface mount SAW device (hereinafter, "SAW device") to be manufactured by a manufacturing method according to one embodiment of the present invention, respectively.

The SAW device 1 includes a mounting substrate 2, conductor bumps 10, a SAW chip 15, and a sealing resin 31A, etc. The mounting substrate 2 is comprised of an insulating substrate 3 consisting of glass, resin, ceramic, glass epoxy, or alumina, external electrodes 4 provided on a bottom of the insulating substrate 3, wiring patterns 5, and internal conductors 6. The SAW chip 15 has connection pads 16 electrically connected to the respective wiring patterns 5 through conductor bumps 10, and an IDT electrode 17 electrically connected to the connection pads 16. The connection pads 5 and the IDT electrode 17 are provided on a lower surface of a piezoelectric substrate 18. An outer surface (as well as upper and side surfaces) of the SAW chip 15 except for a lower surface thereof is coverd by a sealing resin 31A, thereby forming an airtight space S between the IDT electrode 17 and an upper surface of the mounting substrate. The piezoelectric substrate 18 consists of, for example, quartz crystal or lithium tantalate. As a material for the conductor bumps 10, Au is used in this embodiment. Alternatively, a conductive adhesive, a solder, or the like may be used for the conductor bumps 10.

The IDT electrode 17 generates a surface acoustic wave by applying a high-frequency electric field to the IDT electrode 17 from an electric supply terminal, and a generated SAW is converted into a high-frequency electric field by piezoelectric effect, thereby filter having disired characteristics is obtained.

The sealing resin 31A is formed by heating a resin sheet to raise a temperature of the resin sheet up to a softening temperature, pressurizing and deforming the resin sheet, closely attaching the resin sheet to the outer surface of the SAW chip and to an upper surface of the mounting substrate, heating the resin sheet to raise the temperature up to a hardening temperature, and fixing the shape of the resin sheet. The airtightness is maintained by the sealing resin 31A, and the sealing resin 31A reinforces a fixing force by which the SAW chip is fixed to the mounting substrate. The sealing resin 31A also functions as a sealing means for forming a space between the IDT electrode 17 and the upper surface of the insulating substrate 3 into an airtight internal space ("airtight space S") so as to ensure SAW propagation.

Figure 2:
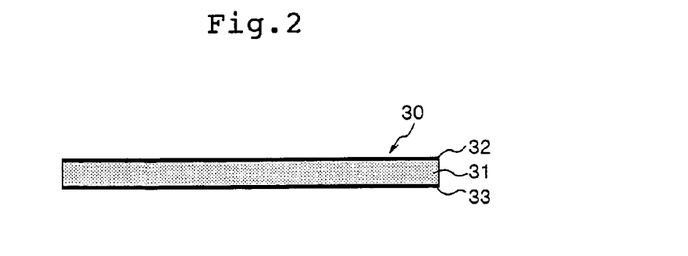
FIG. 2 is an enlarged cross-sectional view which shows one example of a resin sheet.
Figure 3:
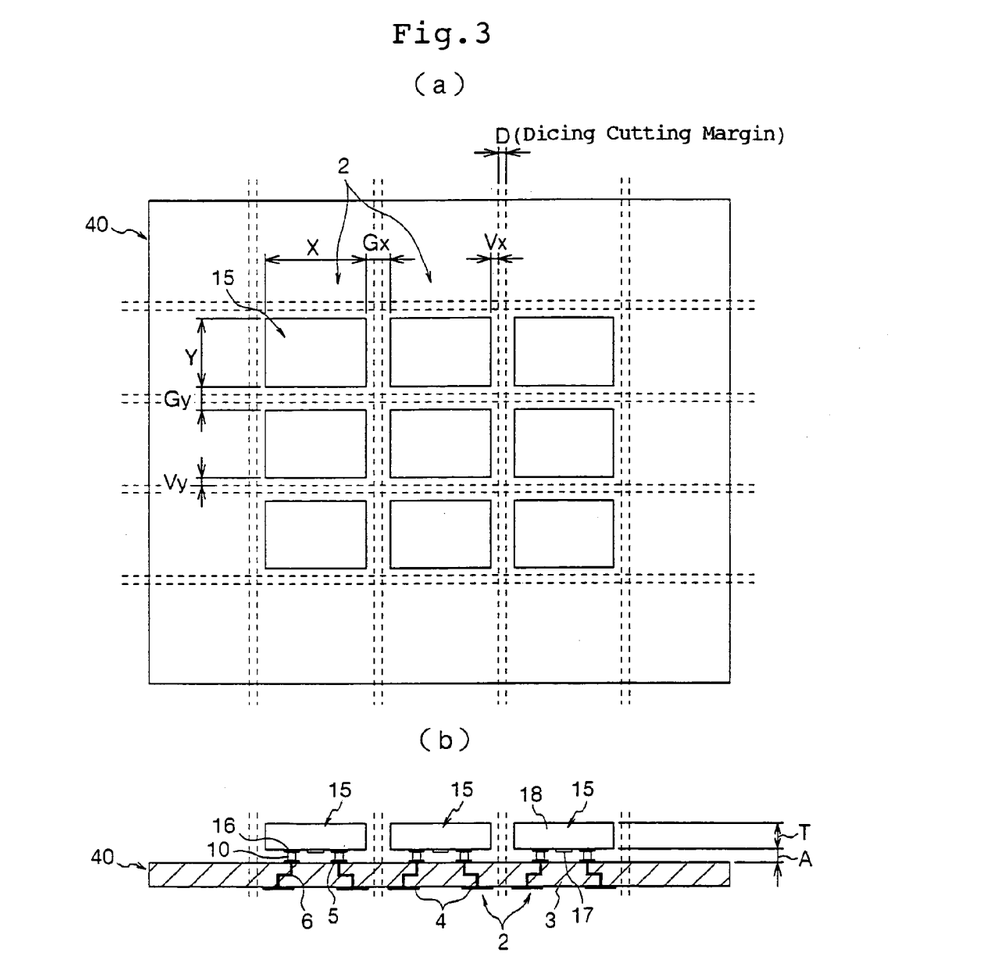

FIG. 2 is an enlarged cross-sectional view which shows one example of a sheet-shaped sealing resin 30. This resin sheet 30 is constituted so that a separable protection film 32 is separably bonded onto one surface of a resin sheet main body 31, and so that a base film 33 is separably bonded onto the other surface of the resin sheet main body 31. The resin sheet main body 31 is obtained by forming a liquid epoxy resin into a sheet, and is deprived of fluidity since the liquid epoxy resin is frozen without being crystallized with a liquid structure kept. The resin sheet main body 31 has thermal plasticity so as to soften the resin sheet 30 at a lamination step to be described later. It is one of features of the present invention to limit a thickness tr of the resin sheet main body 31 to a predetermined value to be described later or more.

Since the resin sheet main body 31 has tackyness, the separable protection film 32 is bonded onto the upper surface of the resin sheet main body 31 so as to facilitate separating the resin sheet at the lamination step and a press molding step to be described later. In this embodiment, polyethylene terephthalate (PET) at a thickness of about 80 μm is used as the protection film 32.

Polyester at a thickness of 50 μm is used as the base film 33.

Steps of manufacturing the SAW chip according to the present invention will next be described based on FIGS. 3 to 9.

The outline of the manufacturing method according to the present invention is as follows. Namely, the manufacturing method includes a flip-chip mounting step, a lamination step, a press molding step, and a post-hardening step. At the flip-chip mounting step, the wiring patterns 5 on the mounting substrate 2 connects the connection pads 16 on the lower surface of the SAW chip through the conductor bumps 10, thereby mounting the SAW chip 15 onto the mounting substrate 2 by flip-chip bonding. At the lamination step, the resin sheet 30 having a large area than the SAW chip on the upper surface of the SAW chip 15 is mounted thereon, and pressured from one end to the other end thereof while softening (or melting) the resin sheet 30, and thereby covering the outer surface of the SAW chip with the resin 31A while securing the airtight space S. At the press molding step, the SAW chip 15 having the outer surface laminated with the resin 31A is pressured and heated, and thereby hardening the resin 31A while suppressing expansion of gas within the airtight space S. At the post-hardening step, the SAW device 1 after the press molding step is heated at a temperature and a time at which the resin 31A is completely hardened.

The characteristic constitution of this manufacturing method is that the thickness tr of the resin sheet 30 before the lamination step is $$L/[(X+Gx)(Y+Gy)] \leq tr, \text{ where}$$

$$L=(X+Gx)(Y+Gy)(H+T+A)-XYT-XYA-[XVyA+YVxA+(4VxVyA)/3]$$

(L: a volume of the resin sheet necessary to seal the outer surface of one SAW chip, X: a length of one side of the SAW chip, Y: a length of the other side of the SAW chip, Gx: a distance between SAW chips adjacent in X direction, Vx: a distance from a dicing cutting margin extending in Y direction to a side surface of the proximate SAW chip, Gy: a distance between the SAW chips adjacent in Y direction, Vy: a distance from a dicing cutting margin extending in X direction to a side surface of the proximate SAW chip, H: a thickness of the resin located on the upper surface of one SAW chip after the outer surface of one SAW chip is completed in being covered with the resin sheet, T: a thickness of the piezoelectric substrate, and A: a distance from an upper surface of a mounting substrate base material to a bottom of the piezoelectric substrate).

Hereafter, the SAW device manufacturing method by batch processing using a sheet shaped mounting substrate which has a predetermined area, and a plurality of SAW chips can be mounted thereon will be described. However, the manufacturing method according to the present invention is also applicable to a manufacturing method including mounting the SAW chips on respective mounting substrate pieces, and then covering the SAW chips with a resin.

FIGS. 3(a) and 3(b) are a plan view and a front longitudinal sectional view which show a step of mounting the SAW chip 15 on each piece region 2 on a mounting substrate base material 40 by flip-chip bonding, respectively. As described with reference to FIG. 1, a region comprising an each piece of the SAW device has the external electrodes 4 provided on the bottom of the insulating substrate 3, and the wiring patterns provided on the upper surface of the insulating substrate 3, and the internal conductors 6. By connecting the SAW chip connection pads 16 onto the respective wiring patterns 5 using the conductor bumps 10, the SAW chip 15 is mounted on the piece region 2 by flip-chip bonding.

Figure 4:
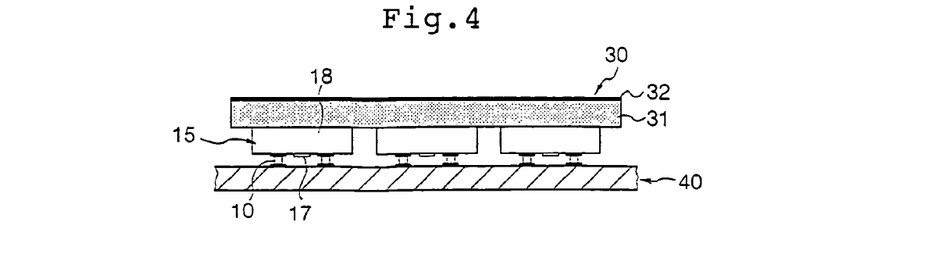
FIG. 4 shows a state in which the lower surface of the resin sheet from which a base film is separated is mounted so as to spread over upper surfaces of a plurality of SAW chips mounted on the mounting substrate base material.

FIG. 4 shows a state in which the resin sheet 30 (resin sheet main body 31) from which the lower surface of the base film 33 (not shown) is peeled is provide over upper surfaces of a plurality of SAW chips 15 (piezoelectric substrates 18) mounted on the mounting substrate base material 40. As explained, the resin sheet main body 31 has the tackyness. Therefore, if the resin sheet 30 from which the base film 33 is peeled is provided on the upper surface of the SAW chip, the resin sheet 30 is temporarily bonded onto the upper surface of the SAW chip 15, thereby preventing positional deviation of the resin sheet in handling or the like.

Figure 5:
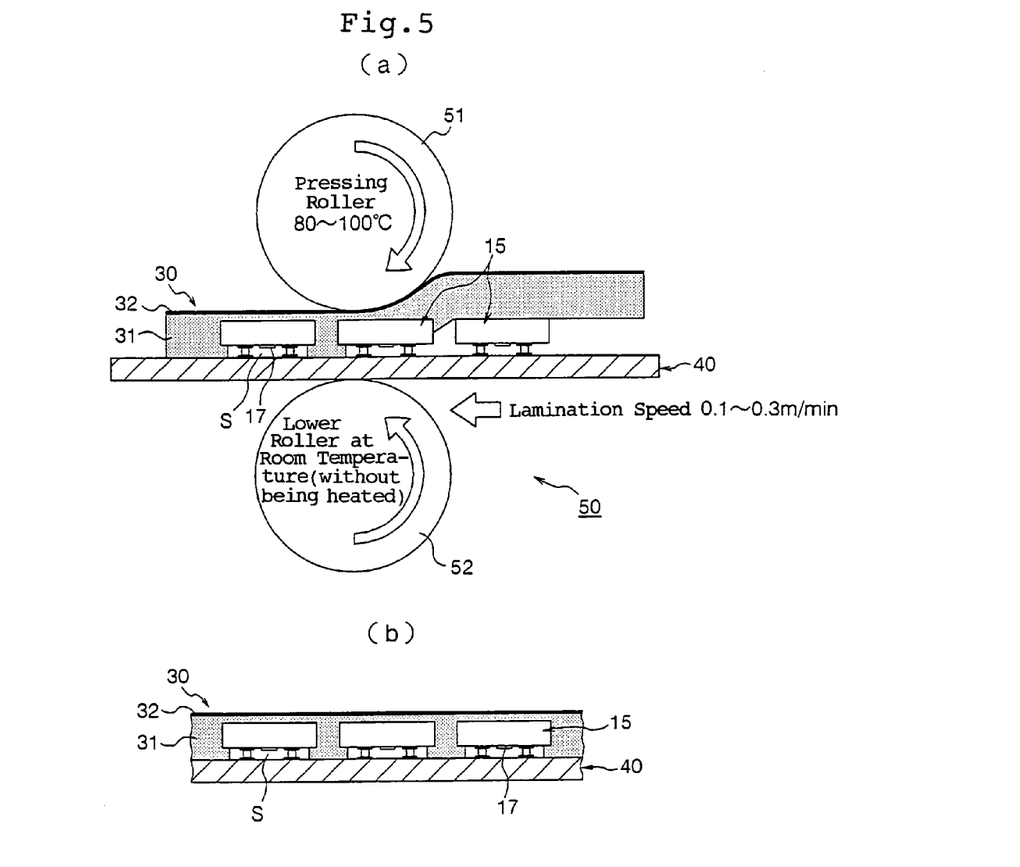

FIG. 5 is a cross-sectional view for explaining the lamination step using a heat roller. The resin sheet 30 temporarily bonded onto each SAW chip 15 is heated and pressured by a lamination device 50.

The lamination device 50 is comprised of a moving means (not shown), a pressing roller 51, and a supporting roller 52. The moving means carries the mounting substrate base material 40 onto which the SAW chip 15 is mounted in a direction indicated by an arrow at a predetermined lamination speed. The pressing roller 51 heated at predetermined temperature is driven to rotate in an arrow direction as its surface being contacted with the upper surface of the resin sheet 30 on the SAW chip 15. The supporting roller 52 serving as a guide member that supports the lower surface of the mounting substrate base material 40, and that generates a pressing force between the supporting roller 52 and the pressing roller 51. The pressing roller 51 is controlled to be heated to a required temperature by a heater (not shown), and is driven by a drive source (not shown) to rotate so as to guide the mounting substrate base material 40 in a lamination direction. The supporting roller 52 rotates in the arrow direction interlockingly with the pressing roller 51 or the mounting substrate base material 40 without any diriven means or is driven to rotate. As the guide member that generates the pressing force between the guide member and the pressing roller 51, a flat stage guide member may be used in place of the supporting roller 52 to guide the lower surface of the mounting substrate base material.

This heat roller lamination step is required to satisfy the following conditions.

(a) A heating temperature of the pressing roller 51 is set to be equal to or higher than the softening (or melting) temperature of the resin sheet 30 and lower than the hardening temperature.

(b) The resin sheet 30 is softened (or molten) by heating and pressurizing the upper surface of the resin sheet 30 using the pressing roller 51.

(c) The resin sheet 30 thus softened (or molten) is heated and pressurized using the pressing roller 51, thereby filling and infiltrating the resin sheet main body 31 in valleys among the SAW chips, and the SAW chips 15 are covered with the resin while securing the airtight space S.

By the lamination step using the pressing roller 51 shown in FIG. 5(a), the SAW chips 15 is laminated by the resin sheet main body 31, and the resin sheet main body is provided to the outer surface of the SAW chip and the upper surface of the mounting substrate base material.

A surface temperature of the pressing roller 51 controlled by the heater is kept to be equal to or higher than the softening temperature of the resin sheet main body 31 and lower than the hardening temperature thereof. In this embodiments, a temperature of resin sheet main body 31 at which the resin sheet 30 can be softened to have an elastic modulus is equal to or higher than 60° C., and a temperature of resin sheet main body 31 at which the resin sheet 30 can be hardened is over 150° C. Therefore, by keeping the surface temperature of the pressing roller 51 at, for example, 80 to 100° C., the resin sheet can be laminated in an optimum softened state. According to the present embodiment, the lower of supporting roller 52 (or the flat stage guide member) is not heated. However, the supporting roller 52 or the flat stage guide member may be heated if it is necessary to do so. A gap between the rollers 51 and 52 is set to be equivalent to a dimension obtained by a combination of an approximate thickness of the mounting substrate base material 40 and a height of the SAW device 15. The gap needs to be appropriately adjusted according to a thickness of the separable protection film 32, the elastic modulus of the resin sheet main body 31, or the like.

The pressing roller 51 is driven to rotate in the arrow direction either manually or motor driving, and the like. As shown in FIG. 5(a), by inserting the mounting substrate base material 40 having the resin sheet 30 temporarily bonded onto the respective SAW chips 15, so as to be put between the rollers 51 and 52, the resin sheet main body 31 enters into the valleys among the SAW chips 15, reaches the mounting substrate surface, and surrounds the SAW chip 15 while securing the airtight space S between each SAW chip 15 and the surface of the mounting substrate base material as shown in FIG. 5(b).

In this embodiment, the heat roller lamination is carried out with the lamination speed set at 0.1 to 0.3 m/minute.

Figure 6:
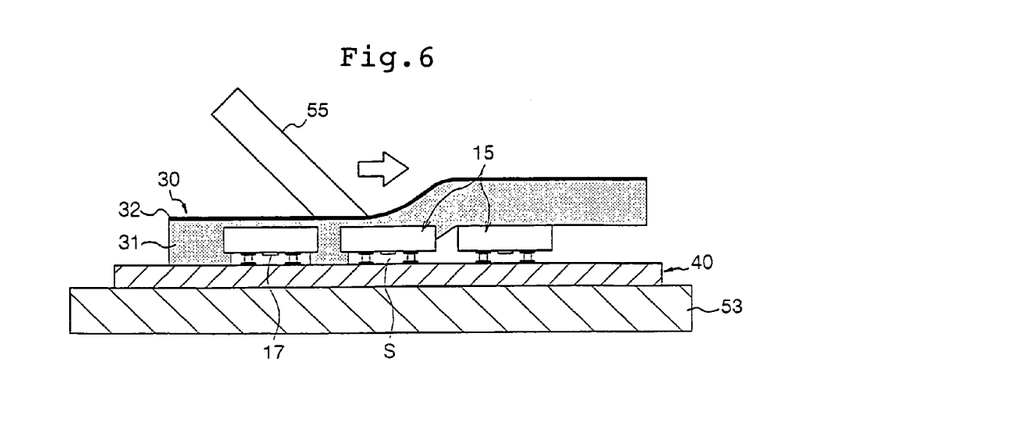
FIG. 6 is an explanatory view for a lamination step using a blade.

The reason for adopting the heat roller lamination in this embodiment is to laminate the resin sheet while sequentially pressurizing the resin sheet 30 from one end toward the other end and extracting the air so as not to unnecessarily expand the airtight space S between the SAW chip 15 and the mounting substrate base material 40. Accordingly, with any method capable of sequentially laminating the resin sheet while sequentially extracting the air, the means other than the pressing roller can be employed for heating and pressurizing the resin sheet. Specifically, for example, as shown in FIG. 6, the lamination device having a heated blade 55 can be used in lieu of the pressing roller 51. The heated blade 55 is driven into the arrow direction while contacting an edge of a blade 55 heated to a predetermined temperature. As a result, the SAW chip 15 is laminated by the resin sheet 30. In this case, the flat stage guide member 53 is employed as the guide member.

If the lamination step is executed in a reduced-pressure atmosphere such as a vacuum oven, then the air can be extracted more efficiently, the adhesiveness of the resin can be improved, and the appropriate airtight space S can be formed.

In addition, if the lamination step is executed in an inert gas atmosphere such as a nitrogen atmosphere, an aging characteristics of the SAW device can be improved.

It is noted that the resin sheet main body 31 is not completely hardened only by the lamination step, so that an additional step of completely hardening the resin sheet main body 31 is necessary. The resin after the lamination step is soft. Due to this, if the resin sheet 30 is heated simply at the hardening temperature, the air within the airtight space S is expanded to force the resin out and the airtight space is enlarged unnecessarily. It is required to completely harden the resin while suppressing this disadvantage. It is the press molding step that is executed to this end.

Namely, FIGS. 7(a) and 7(b) are explanatory views for the press molding step after the lamination step. By executing this press molding, it is possible to prevent the airtight space S from being enlarged unnecessarily due to the expansion of the air by heating.

Figure 7:
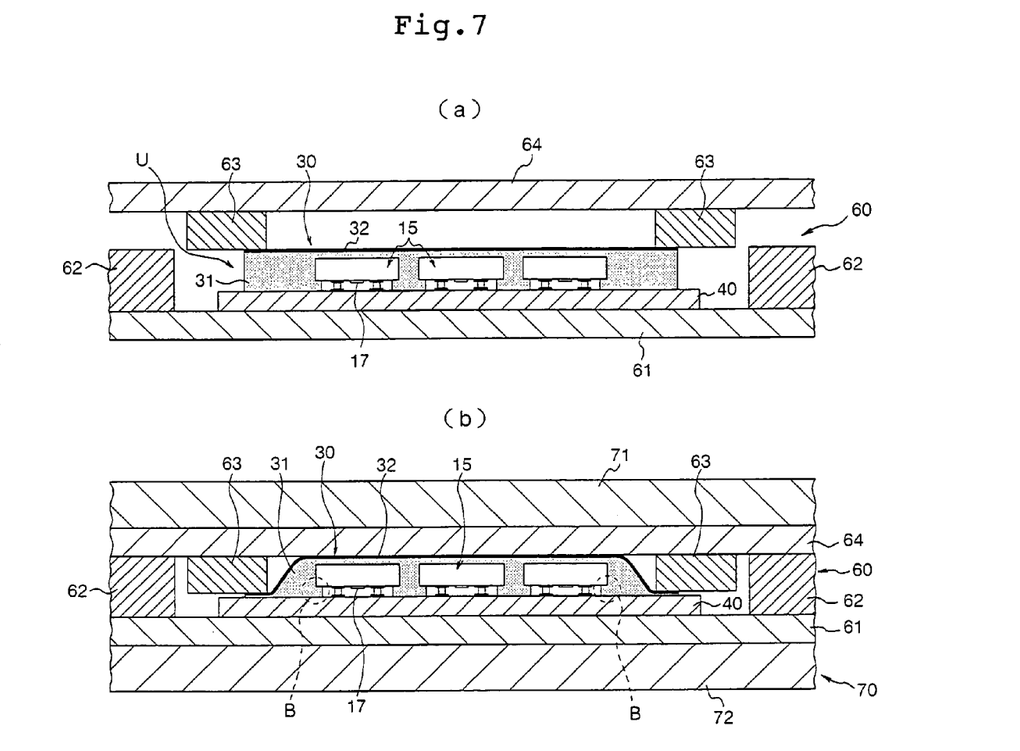
Figure 8:
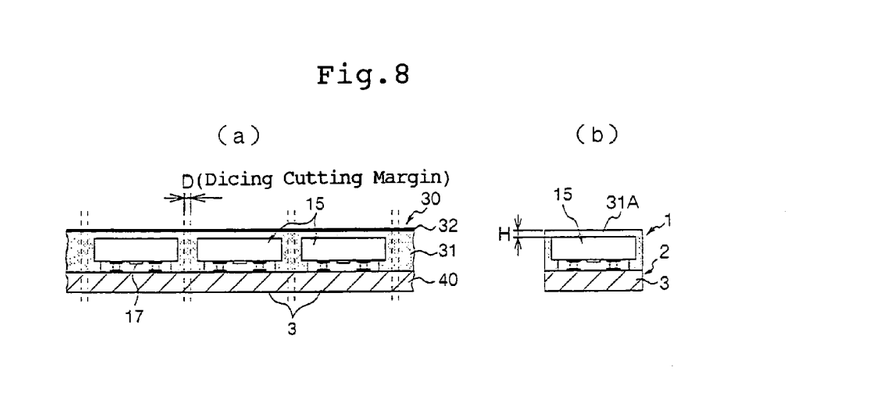
Figure 9:
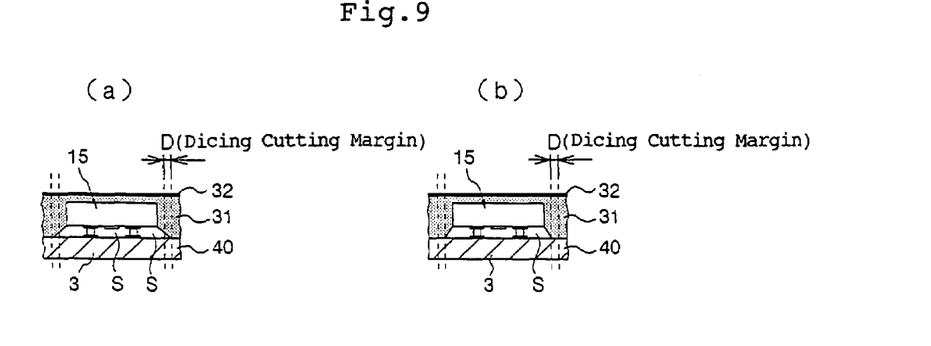
FIG. 9 is an explanatory view for a finished SAW chip, wherein FIG. 9(*a*) shows a defective SAW chip and FIG. 9(*b*) shows a good SAW chip.

The press molding step is executed by a pressing device 60. This pressing device 60 includes a metal die 61, spacers 62, a frame 63, a metal plate (pressurizing member) 64, and a pressing machine 70 and 71. The metal die 61 supports the bottom of the mounting substrate base material 40. The spacers 62 provided on the metal die 61 so as to located at outside of the mounting substrate base material 40. The frame 63 is provided on the resin sheet so as to contact the lower side of the frame with an outer edge of the upper surface of the resin sheet 30 laminated on the mounting substrate base material 40. The metal plate 64 pressurizes an upper surface of the frame 63.

As shown in FIG. 7(a), the mounting substrate base material completed with the lamination step and laminated with the resin (see FIG. 5(b), hereinafter, "laminated unit U") is mounted on an upper surface of the metal die 61, and the spacers 62 (made of Teflon®) are provided at outside of the laminated unit U so as not to excessively apply a pressure to the laminated unit U. The spacers 62 are fixed onto the upper surface of the metal die 61. The frame 63 (made of Teflon®), which has an annular shape and whose diamater is larger than a region in which the SAW chips 15 are mounted, is mounted on the resin sheet 30 of the laminated unit U, and the metal plate 64 is mounted on the frame 63.

After setting the laminated unit U as shown in FIG. 7(a), the press molding shown in FIG. 7(b) is performed using the pressing machine 70. The pressing machine 70 is composed of an upper die (pressurizing member) 71 and a lower die 72, and temperatures of the upper die 71 and the lower die 72 are set at 150° C. that is the hardening temperature for hardening the resin. The pressing is performed while mounting the metal die 61 on the lower die 72, and contacting the upper die 71 with the upper surface of the metal plate 64.

Since the resin is hardened while forcibly suppressing the expansion of the air within the airtight space S by pressing, the unnecessary enlargement of the airtight space by the air expansion does not occur. In addition, by performing the press molding while the resin located below the frame 63 is pressed, the air expansion (voids) that tends to occur particularly at portions B shown in FIG. 7(b) located on outer edges of the SAW chips mounted on the mounting substrate base material 40 can be suppressed.

In this embodiment, the frame 63 is employed as the frame that pressurizes the outer peripheral edges of the upper surface of the resin sheet. The frame 63 made of Teflon is given only for illustrative purposes and a frame consisting of a material other than Teflon may be employed. Further, the frame 63 may be integrated with the metal plate (pressurizing member) 64. If the outer peripheral edges of the upper surface of the resin sheet are pressurized directly by the upper die (pressurizing member) 71 of the pressing machine without using the metal plate 64, the frame 63 may be integrated with the lower surface of the upper die 71 of the pressing machine.

Furthermore, since the frame 63 is the means for suppressing expansion in the horizontal direction of the resin sheet 30, the frame 63 is not always needed to be arranged on the upper surface of the resin sheet 30 but the annular frame 63 may be integrally provided on the mounting substrate base material 40 corresponding to the outside of the SAW chips in advance as long as the purpose is attained. In this case, if the frame is fixed onto the flat mounting substrate base material 40 as a separate member, the positional deviation of the frame may possibly occur. However, the disadvantage of the positional deviation of the frame or the like can be prevented if the mounting substrate base material consists of, for example, ceramic (alumina) and the frame consisting of the same material as that for the base material is manufactured integrally with the base material in advance.

According to this embodiment, the flat press molding is finished after the state shown in FIG. 7(b) is maintained for ten minutes. The resin sheet 30 employed in this embodiment can prevent the resin from being forced out by the air expansion if the flat press molding shown in FIG. 7(b) is performed sufficiently.

A post-hardening step is executed after the press molding step. At the post-hardening step, the laminated unit U is arranged within a constant-temperature bath (a post-hardening device) having an atmospheric temperature set at 150° C. in a state shown in FIG. 8(a), and heated for three hours. The temperature and the time are sufficient to completely harden the resin sheet main body 31 of the resin sheet 30 adopted in this embodiment, and hardening conditions need to be selected appropriately, depending on differences in conditions such as the material for the resin sheet to be used. The protection film 32 may be separated either before or after the post-hardening step as long as the film 32 is separated after the press molding step. According to this embodiment, the PET that is the protection film 32 is separated after the post-hardening step.

The unit U after the post-hardening step is diced along dicing cutting margins shown in FIG. 8(a) using a dicing blade having a width of D, thereby obtaining pieces of SAW devices shown in FIG. 8(b).

Generally, dicing is performed while splashing water, chemicals, or the like to the dicing blade and objects to be cutted. Due to this, the resin that serves as the sealing material sometimes absorbs water. If the absorption of the water by the resin may possibly deteriorate the dampproofness of the SAW devices and the aging characteristics thereof, or if a steam explosion phenomenon (popcorn phenomenon) causes damage to the sealing resin, then a baking step may be provided after the dicing so as to extract the moisture from the resin.

The resin sealing method according to the present invention composed of the four steps of the flip-chip mounting step, the lamination step, the press molding step, and the post-hardening step has been described above. In the resin sealing method according to the present invention, the thickness of the resin sheet 30 (particularly the thickness of the resin sheet main body 31) is quite an important factor. That is, if the thickness of the resin sheet main body 31 is insufficient, the resin filled into the valleys among the SAW chips forms the airtight space S which has been enlarged greatly outward of the SAW chip 15 as shown in FIG. 9(a). As a result, the airtight space S reaches the dicing cutting margins. In this state, if the substrate is diced into pieces of the SAW devices, holes are formed in the side surface of the resin, thereby greatly deteriorating the dustproofness and the dampproofness of the SAW devices. To prevent the deterioration, it is necessary to calculate the thickness of the resin sheet main body so that the resin filled into the valleys among the SAW chips are more proximate to the SAW chips as shown in FIG. 9(b) at least, and to employ the resin sheet main body having a thickness equal to or larger than the calculated thickness.

To this end, a volume of the resin necessary to provide the state shown in FIG. 9(b) is calculated, and the volume is divided by an area of the mounting substrate per SAW chip, whereby the minimum thickness of the resin sheet main body 31 can be calculated.

Namely, if the thickness of the resin sheet main body 31 is tr, the tr needs to satisfy the following conditions.

$$L/[(X+Gx)(Y+Gy)]-tr, \text{ where}$$

$$L=(X+Gx)(Y+Gy)(H+T+A)-XYT-XYA-[XVyA+YVxA+(4VxVyA)/3]$$

(L: a volume of the resin sheet necessary to seal the outer surface of one SAW chip, X: a length of one side of the SAW chip, Y: a length of the other side of the SAW chip, Gx: a distance between SAW chips adjacent in X direction, Vx: a distance from a dicing cutting margin extending in Y direction to a side surface of the proximate SAW chip, Gy: a distance between the SAW chips adjacent in Y direction, Vy: a distance from a dicing cutting margin extending in X direction to a side surface of the proximate SAW chip, H: a thickness of the resin located on the upper surface of one SAW chip after the outer surface of one SAW chip is completed in being covered with the resin sheet, T: a thickness of the piezoelectric substrate, and A: a distance from an upper surface of a mounting substrate base material to a bottom of the piezoelectric substrate)

According to an example carried out by the present inventor, X=1.62 mm, Y=1.22 mm, Gx=0.58 mm, Gy=0.58 mm, Vx=0.19 mm, Vy=0.19 mm, H=0.1 mm, T=0.35 mm, and A=0.03 mm, therefore, the thickness tr needs to be set to be equal to or larger than 0.286 mm, and the resin sheet at tr=0.33 mm is employed, accordingly.

As an upper limit of the thickness tr of the resin sheet main body, a value at which the resin does not excessively enter into the airtight space and does not adhere to SAW propagation regions may be selected. Since the resin sheet main body 31 adopted by the inventor of the present invention has the thermal plasticity, it is softened but not molten. Therefore, there is no fear to penetrate the resin into the airtight space. Conversely, however, a disadvantage that the resin does not enter into necessary portions may possibly occur. Therefore, the thickness tr of the resin sheet main body needs to be appropriately selected using the above Equation. It is noted that even the resin that is molten when being heated can be applied to the present invention as long as the viscosity of the resin after being molten is higher than a predetermined viscosity.

Moreover, the resin sealing method according to the present invention performs pressurization both at the lamination step and the press molding step. Therefore, the low adhesiveness between the mounting substrate and the high-viscosity resin that is the disadvantage of the method disclosed in the International publication No. WO97/02596 can be solved.

"Teflon" referred herein is a registered trademark.

As described so far, according to the present invention, for the surface mount SAW device constituted so that outer surface of the SAW chips mounted on a mounting substrate by face-down bonding is covered with heated and softened resin and so that the resin is filled into gaps between skirts of the SAW chips and an upper surface of the mounting substrate to thereby form an airtight space between IDT electrodes on lower surfaces of the SAW chips and the upper surface of the mounting substrate, it is possible to dispense with negative pressure suction from through holes formed in the mounting substrate so as to ensure a filling amount of the resin into the gaps, and dispense with strict management of heating temperature and suction profiles so as to ensure adhesiveness between the resin and the mounting substrate.

According to the invention of claim 1, by setting the thickness of the resin sheet to be used at an appropriate value when executing the resin sealing step, it is possible to ensure spreading the softened resin over the skirts of the SAW chip and form the airtight space, and possible to prevent deformation of the sealing resin due to thermal expansion of the airtight space. In particular, when the substrate is divided into pieces of the SAW devices by dicing, there is no fear of forming holes communicating the airtight space with the external air in the resin portions.

According to the invention of claim 2, it is possible to ensure filling the softened resin into the valleys among the SAW chips, and possible to form the airtight space having an ideal shape and an ideal volume.

According to the invention of claim 3, the lamination step may be executed by pressurizing and pressing the resin sheet using the heated blade instead of using the heat roller, and this lamination step can exhibit the same advantage as that of the lamination step using the heat roller.

According to the invention of claim 4, the resin sheet main body has such a viscosity as to be temporarily bonded onto the SAW chip when being provided on the SAW chip. Therefore, by bonding the protection film having a good separation property onto the upper surface of the resin sheet against which the pressurizing member or the like is contacted, the disadvantage that the resin sheet adheres to the pressing roller, the blade, and the pressurizing member at the lamination step and the pressing molding step can be prevented.

According to the invention of claim 5, since the protection film consists of polyethylene terephthalate (PET), the separation property can be secured.

According to the invention of claim 6, since the lamination step is executed in the reduced-pressure atmosphere, the air extraction during the lamination step can be securely performed.

According to the invention of claim 7, since the lamination step is executed in the inert gas atmosphere, the airtight space after the completion of resin sealing is filled with an inert gas, thereby the SAW device having a good aging characteristics will be obtained.

According to the invention of claim 8, by performing the batch processing using the mounting substrate base material, mass-productivity can be improved.

According to the invention of claim 9, by using the spacers to prevent excessive pressing without depending on fine adjustment of a pressing force by the pressing roller and the blade that constitute the lamination device, it is possible to appropriately fill the resin sheet into the valleys among the SAW chips and expand the resin sheet.

According to the invention of claim 10, by providing the large-area resin sheet on a plurality of SAW chips densely arranged on the mounting substrate base material, and press-molding the outer periphery of the upper surface of the resin sheet through the frame, the resin located below the frame is pressed, and entry of the resin into the skirts of the SAW chips located on the outer periphery of the SAW chips can be accelerated.

According to the invention of claim 11, the frame is integrated with the pressurizing member that press-molds the frame. The frame may be provided separately from the pressurizing member (the metal plate or the upper die of the pressing machine). However, the integrated frame is convenient to handle and can improve workability.

According to the invention of claim 12, the frame is integrated onto the mounting substrate base material. Since the frame is means for preventing the resin sheet from being expanded sideway when the resin sheet is pressurized, the frame may be arranged on the upper surface of the mounting substrate base material.

The invention claimed is:

1. A method of manufacturing a surface mount SAW device, the surface mount SAW device comprising: a mounting substrate that includes an insulating substrate, an external electrode for surface mount arranged on a bottom of the insulating substrate, and a wiring pattern arranged above the insulating substrate and said external electrode; a SAW chip that includes a piezoelectric substrate, an IDT electrode formed on one surface of the piezoelectric substrate, and a connection pad connected to said wiring pattern through a conductor bump; and a sealing resin that is formed to cover the SAW chip from an outer surface of the SAW chip to an upper surface of the mounting substrate while mounting said SAW chip on the mounting substrate in a face-down state by flip-chip bonding, and that thereby forms an airtight space between said IDT electrode and said mounting substrate, the method comprising:

a flip-chip mounting step of connecting said wiring pattern to said connection pad through said conductor bump, thereby mounting the SAW chip on said mounting substrate by the flip-chip bonding;

a lamination step of mounting a resin sheet, larger in an area than an upper surface of said SAW chip, on the upper surface of the SAW chip, and pressurizing the resin sheet while softening or melting the resin sheet from one end of the mounting substrate to the other end of the mounting substrate, thereby covering the outer surface of the SAW chip with a resin while securing said airtight space;

a press molding step of pressurizing and heating the SAW chip having the outer surface laminated with said resin, thereby hardening the resin while suppressing expansion of a gas within said airtight space; and a post-hardening step of heating the SAW device which has been subjected to the press molding step at a temperature and at a time at which the resin is completely hardened, wherein a thickness tr of the resin sheet before said lamination step satisfies:

$L/[(X+Gx)(Y+Gy)] \leq tr$, where $L=(X+Gx)(Y+Gy)(H+T+A)-XYT-XYA-[XVyA+YVxA+(4VxVyA)/3]$, (L: a volume of the resin sheet necessary to seal the outer surface of one SAW chip, X: a length of one side of the SAW chip, Y: a length of the other side of the SAW chip, Gx: a distance between SAW chips adjacent in X direction, Vx: a distance from a dicing cutting margin extending in Y direction to a side surface of the proximate SAW chip, Gy: a distance between the SAW chips adjacent in Y direction, Vy: a distance from a dicing cutting margin extending in X direction to a side surface of the proximate SAW chip, H: a thickness of the resin located on the upper surface of one SAW chip after the outer surface of one SAW chip is completed in being covered with the resin sheet, T: a thickness of the piezoelectric substrate, and A: a distance from an upper surface of a mounting substrate base material to a bottom of the piezoelectric substrate).

2. The surface mount SAW device manufacturing method according to claim 1, wherein said lamination step includes a heat roller lamination step of pressurizing the mounting substrate and the SAW chip between a pressing roller rotating while being press-contacted with an upper surface of said resin sheet and heated to a predetermined temperature, and a guide member provided on a lower surface of said mounting substrate, and the heat roller lamination step satisfies the following conditions:

(a) a heating temperature of the pressing roller is set to be equal to or higher than a softening or melting temperature of the resin sheet and lower than a hardening temperature of the resin sheet;

(b) the resin sheet is softened or molten by heating and pressurizing the upper surface of said resin sheet using said pressing roller; and (c) the resin sheet thus softened or molten is heated and pressurized using the pressing roller, thereby covering the SAW chip with the resin while securing said airtight space.

3. The surface mount SAW device manufacturing method according to claim 1, wherein said lamination step includes a blade lamination step of pressurizing the mounting substrate and the SAW chip between a blade moving in one direction while being press-contacted at its tip with an upper surface of said resin sheet, and heated to a predetermined temperature, and a guide member provided on a lower surface of said mounting substrate, and the blade lamination step satisfies the following conditions:

(a) a heating temperature of said blade is set to be equal to or higher than a softening or melting temperature of the resin sheet and lower than a hardening temperature of the resin sheet;

(b) said resin sheet is softened or molten by heating and pressurizing the upper surface of said resin sheet using said blade; and (c) the resin sheet thus softened or molten is heated and pressurized using the blade, thereby covering the SAW chip with the resin while securing the airtight space.

4. The surface mount SAW device manufacturing method according to claim 1, 2, or 3, wherein said resin sheet is constituted so that a separable protection film is bonded onto an upper surface of a resin sheet main body that has viscosity, and after said lamination step and said press molding step are sequentially executed while a lower surface of the resin sheet main body is provided on the upper surface of said SAW chip, said protection film is separated.

5. The surface mount SAW device manufacturing method according to claim 4, wherein said protection film consists of polyethylene terephthalate (PET).

6. The surface mount SAW device manufacturing method according to claim 4, wherein said lamination step is executed in a reduced-pressure atmosphere.

7. The surface mount SAW device manufacturing method according to claim 4, wherein said lamination step is executed in an inert gas atmosphere.

8. The surface mount SAW device manufacturing method according to claim 4, wherein said mounting substrate is a mounting substrate base material having a plurality of mounting substrate pieces connected to one another to form a sheet, and at said lamination step, the resin sheet having a large area is laminated on a plurality of SAW chips mounted on the mounting substrate base material after the large-area resin sheet is provided to spread over upper surfaces of the plurality of SAW chips.

9. The surface mount SAW device manufacturing method according to claim 1, wherein said protection film consists of polyethylene terephthalate (PET).

10. The surface mount SAW device manufacturing method according to claim 9, wherein said lamination step is executed in a reduced-pressure atmosphere.

11. The surface mount SAW device manufacturing method according to claim 9, wherein said lamination step is executed in an inert gas atmosphere.

12. The surface mount SAW device manufacturing method according to claim 9, wherein said mounting substrate is a mounting substrate base material having a plurality of mounting substrate pieces connected to one another to form a sheet, and at said lamination step, the resin sheet having a large area is laminated on a plurality of SAW chips mounted on the mounting substrate base material after the large-area resin sheet is provided to spread over upper surfaces of the plurality of SAW chips.

13. The surface mount SAW device manufacturing method according to claim 1, wherein said lamination step is executed in a reduced-pressure atmosphere.

14. The surface mount SAW device manufacturing method according to claim 13, wherein said mounting substrate is a mounting substrate base material having a plurality of mounting substrate pieces connected to one another to form a sheet, and at said lamination step, the resin sheet having a large area is laminated on a plurality of SAW chips mounted on the mounting substrate base material after the large-area resin sheet is provided to spread over upper surfaces of the plurality of SAW chips.

15. The surface mount SAW device manufacturing method according to claim 1, wherein said lamination step is executed in an inert gas atmosphere.

16. The surface mount SAW device manufacturing method according to claim 15, wherein said mounting substrate is a mounting substrate base material having a plurality of mounting substrate pieces connected to one another to form a sheet, and at said lamination step, the resin sheet having a large area is laminated on a plurality of SAW chips mounted on the mounting substrate base material after the large-area resin sheet is provided to spread over upper surfaces of the plurality of SAW chips.

17. The surface mount SAW device manufacturing method according to claim 1, wherein said mounting substrate is a mounting substrate base material having a plurality of mounting substrate pieces connected to one another to form a sheet, and at said lamination step, the resin sheet having a large area is laminated on a plurality of SAW chips mounted on the mounting substrate base material after the large-area resin sheet is provided to spread over upper surfaces of the plurality of SAW chips.

18. The surface mount SAW device manufacturing method according to claim 17, wherein at said press molding step, said frame is arranged on said mounting substrate base material so as to surround the plurality of SAW chips at a position away at an outside diameter side, the resin sheet provided on upper surfaces of the plurality of SAW chips is press-molded, and expansion of the mounting substrate base material toward a side surface of the resin sheet is suppressed by an inner peripheral surface of the frame.

19. The surface mount SAW device manufacturing method according to claim 17, wherein at said press molding step, a frame is arranged on the resin sheet provided on the plurality of SAW chips mounted on said mounting substrate base material, the overall mounting substrate base material is press-molded together with the frame, and the mounting substrate base material is press-molded while the resin located below the frame is pressed.

20. The surface mount SAW device manufacturing method according to claim 10, wherein
said frame is integrated with a pressurizing member that press-molds the frame.

21. The surface mount SAW device manufacturing method according to claim 17, wherein
at said press molding step executed using pressurizing plates provided on upper and lower side surfaces sides, respectively after the large-area resin sheet is laminated on the plurality of SAW chips mounted on said mounting substrate base material, spacers are used to limit a pressing force of said pressurizing plates so as to prevent an excessive pressure from being applied to the SAW chip pieces laminated with the resin.

22. The surface mount SAW device manufacturing method according to claim 21, wherein
at said press molding step, a frame is arranged on the resin sheet provided on the plurality of SAW chips mounted on said mounting substrate base material, the overall mounting substrate base material is press-molded together with the frame, and the mounting substrate base material is press-molded while the resin located below the frame is pressed.

23. The surface mount SAW device manufacturing method according to claim 21, wherein
at said press molding step, said frame is arranged on said mounting substrate base material so as to surround the plurality of SAW chips at a position away at an outside diameter side, the resin sheet provided on upper surfaces of the plurality of SAW chips is press-molded, and expansion of the mounting substrate base material toward a side surface of the resin sheet is suppressed by an inner peripheral surface of the frame.

* * * * *